(12) United States Patent
Chen et al.

(10) Patent No.: US 7,649,583 B2
(45) Date of Patent: Jan. 19, 2010

(54) SEMICONDUCTOR STRUCTURE AND FABRICATING METHOD THEREOF FOR LIQUID CRYSTAL DISPLAY DEVICE

(75) Inventors: Yu-Cheng Chen, Hsinchu (TW); Ta-wei Chiu, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 218 days.

(21) Appl. No.: 11/958,356

(22) Filed: Dec. 17, 2007

(65) Prior Publication Data

US 2008/0225190 A1    Sep. 18, 2008

(30) Foreign Application Priority Data

Mar. 15, 2007    (TW) .............................. 96108926 A

(51) Int. Cl.
*G02F 1/136* (2006.01)
*G02F 1/1343* (2006.01)

(52) U.S. Cl. .............................. 349/43; 349/38; 349/39
(58) Field of Classification Search .................... 349/43, 349/38, 39; 438/30
See application file for complete search history.

(56) References Cited

U.S. PATENT DOCUMENTS

| | | | |
|---|---|---|---|
| 6,255,130 B1 * | 7/2001 | Kim | 438/30 |
| 6,287,899 B1 * | 9/2001 | Park et al. | 438/149 |
| 6,335,276 B1 * | 1/2002 | Park et al. | 438/648 |
| 6,744,486 B2 * | 6/2004 | Kim et al. | 349/187 |
| 2004/0252250 A1 | 12/2004 | Yang et al. | |

\* cited by examiner

*Primary Examiner*—David Nelms
*Assistant Examiner*—David Y Chung
(74) *Attorney, Agent, or Firm*—Jianq Chyun IP Office

(57) ABSTRACT

A method for fabricating a semiconductor structure with a multi-layer storage capacitor is provided. A substrate having an active element area and a storage capacitor area is provided. By sequentially fabricating a semiconductor layer, a first inter-layer dielectric (ILD) layer, a gate and a first electrode, a source and a drain in the semiconductor layer in the active element area, a second ILD layer, a patterned conductive layer served as a pixel electrode, a patterned third ILD layer, a plurality of contact windows in the first, second and third ILD layers for exposing the source, the drain, parts of the patterned conductive layer and the first electrode, a second electrode and a source/drain conductive line, the semiconductor structure with the multi-layer storage is obtained in consequence.

24 Claims, 14 Drawing Sheets

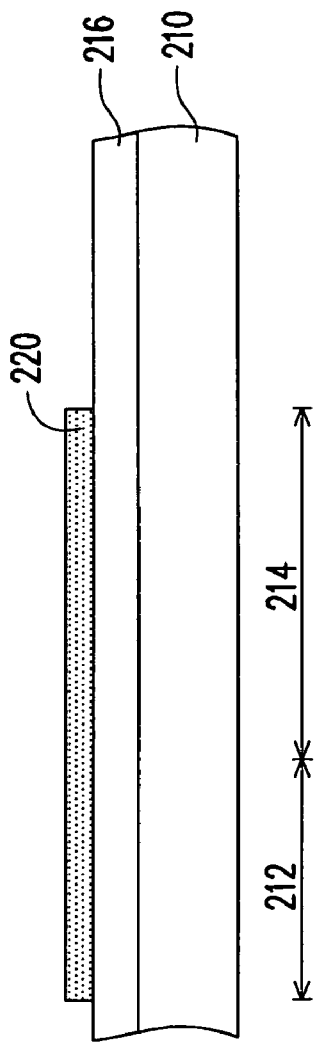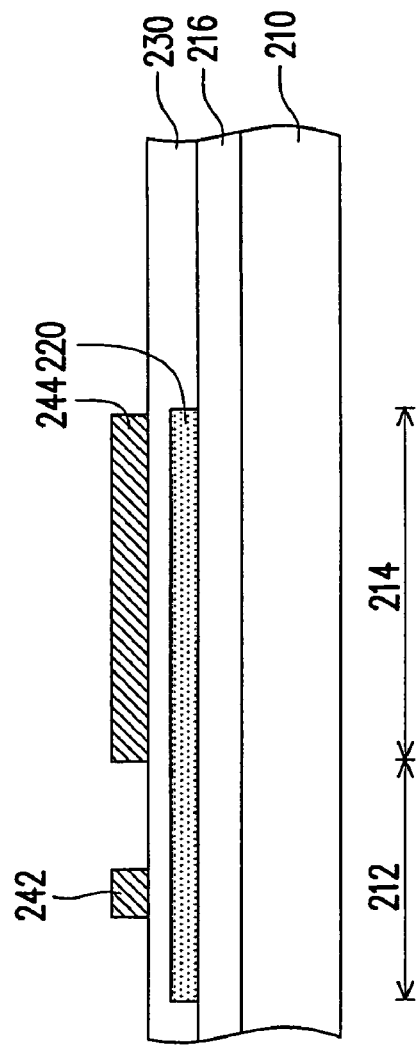

SEMICONDUCTOR STRUCTURE AND FABRICATING METHOD THEREOF FOR LIQUID CRYSTAL DISPLAY DEVICE

CROSS-REFERENCE TO RELATED APPLICATION

This application claims the priority benefit of Taiwan application serial no. 96108926, filed on Mar. 15, 2007. The entirety of the above-mentioned patent application is hereby incorporated by reference herein and made a part of this specification.

BACKGROUND OF THE INVENTION

1. Field of the Invention

The present invention relates to a semiconductor structure and a fabricating method thereof, and more particularly to both a semiconductor structure and a pixel structure having a multi-layer storage capacitor and a fabricating method for manufacturing the same.

2. Description of Related Art

The thin film transistor (TFT) is often used as a driving element in a display device. Generally, the TFT can be divided into the amorphous silicon TFT and the low temperature poly-silicon (LTPS) TFT. Since the electron mobility of the LTPS-TFT is over 200 $cm^2$/V-sec, the LTPS-TFT can be fabricated in smaller size and thereby increasing the aperture ratio. Therefore, the brightness of the display device is thus increased and the power consumption is reduced. In addition, a storage capacitor for storing data voltage is also fabricated during the fabricating process of the TFT, so as to improve the display quality.

FIGS. 1A-1F are schematic cross-sectional views illustrating a conventional fabricating process of a pixel structure having an LTPS-TFT and a storage capacitor. Referring to FIG. 1A, a substrate 110 is provided. Poly-silicon layers 122 and 124 are formed in an active element area 112 and in a storage capacitor area 114 of the substrate 110 respectively. In this step, a first photomask (not illustrated) is applied to perform patterning process and thereby obtaining the poly-silicon layers 122 and 124.

Afterwards, referring to FIG. 1B, a gate insulating layer 130 is formed on the substrate 110 to cover the poly-silicon layers 122 and 124. A gate 142 and a first electrode 144 are respectively formed over the poly-silicon layers 122 and 124. In this step, a second photomask (not illustrated) is applied to perform patterning process and thereby obtaining the gate 142 and the first electrode 144. Particularly, as shown in FIG. 1B, the gate 142 is utilized as a mask to perform a self-aligned doping process 150 so that a source 122a, a drain 122b are formed in the poly-silicon layer 122, and a channel 122c is between the source 122a and the drain 122b. Furthermore, a lightly doped drain (LDD) area 122d is also formed in the poly-silicon layer 122 to reduce current leakage.

Referring to FIG. 1C, a patterned dielectric layer 160 is formed on the substrate 110. In this step, a third photomask (not illustrated) is utilized to perform patterning process and thereby fabricating a contact window 162 in the patterned dielectric layer 160 so as to expose the source 122a and the drain 122b.

Then, referring to FIG. 1D, a source/drain conductive line 172 and a second electrode 174 are fabricated on the patterned dielectric layer 160. The source/drain conductive line 172 is filled into the contact window 162 and thus electrically connected to the source 122a and the drain 122b. In this step, a fourth photomask (not illustrated) is applied to perform patterning process and thereby obtaining the source/drain conductive line 172 and the second electrode 174.

Referring to FIG. 1E, a patterned planar layer 180 is formed on the substrate 110. In this step, a fifth photomask (not illustrated) is utilized to perform patterning process and thereby fabricating a contact window 182 in the patterned planar layer 180 so as to expose a portion of the source/drain conductive line 172.

Referring to FIG. 1F, a pixel electrode 190 is formed on the patterned planar layer 180. The pixel electrode 190 is filled into the contact window 182 and thus contacting the source/drain conductive line 172. In this step, a sixth photomask (not illustrated) is utilized to perform patterning process and thereby fabricating a contact window 182 in the patterned planar layer 180. After fabricating processes of FIG. 1A~1F, a conventional pixel structure 100 is obtained, and six photomasks are required to perform the above fabricating method. Because the photomask is expensive, the cost of the conventional fabricating process is hard to be reduced.

Furthermore, please refer to FIG. 1F, a storage capacitor 195 is disposed in the storage capacitor area 114 of the substrate 110. A first storage capacitor is formed by the poly-silicon layer 124, the gate insulating layer 130 and the first electrode 144. A second storage capacitor is formed by the first electrode 144, the patterned dielectric layer 160 and the second electrode 174. Referring to FIG. 1B again, the poly-silicon layer 124 in the storage capacitor area 114 is covered by the first electrode 144, so the poly-silicon layer 124 cannot be doped during the doping process 150. Consequently, the storage capacitance of a storage capacitor 195 cannot be effectively increased. Hence, display quality of the display device utilizing the pixel structure 100 is poor.

SUMMARY OF THE INVENTION

Accordingly, the present invention is directed to a fabricating method of a semiconductor structure which reduces the number of the required photomask so as to lower the fabrication cost.

The invention is directed to a semiconductor structure having a multi-layer storage capacitor to mitigate the problem of insufficient storage capacitance.

The invention is directed to a pixel structure including a semiconductor structure having a multi-layer storage capacitor so as to mitigate the problem of insufficient storage capacitance.

The invention is directed to a liquid crystal display (LCD) panel utilizing a pixel structure with a multi-layer storage capacitor and thereby improving the display quality of the LCD panel.

Based on the above, the invention provides a fabricating method of a semiconductor structure, wherein a semiconductor layer is first formed on a substrate. The semiconductor layer is disposed in an active element area and a storage capacitor area of the substrate. A first inter-layer dielectric layer is formed to cover a semiconductor layer. A gate is formed on the first inter-layer dielectric layer in the active element area, and a first electrode is formed on the first inter-layer dielectric layer in the storage capacitor area. A doping process is performed to form a source and a drain in the semiconductor layer in the active element area. A channel is between the source and the drain. A second inter-layer dielectric layer is formed to cover the gate and the first electrode. A patterned conductive layer is formed on the second inter-layer dielectric layer as a pixel electrode. A third inter-layer dielectric layer is formed to cover the patterned conductive layer. The third inter-layer dielectric layer is patterned to expose the patterned conductive layer, and a plurality of contact windows is also formed in the first, second and third inter-layer dielectric layers to expose the source, drain, a portion of the patterned conductive layer, and the first electrode. A second electrode is formed on the third inter-layer dielectric layer. The second electrode is disposed over the first electrode and electrically connected to the first electrode and a source/drain conductive line is formed so as to electrically connect the semiconductor layer with the patterned conductive layer.

According to one embodiment of the invention, the semiconductor layer and the patterned conductive layer are electrically coupled as a first capacitor electrode. The first electrode and the second electrode are electrically coupled as a second capacitor electrode. The first capacitor electrode and the second capacitor electrode constitute a storage capacitor.

According to one embodiment of the invention, the fabricating method of the semiconductor structure further includes forming a patterned protective layer on the second electrode and the source/drain conductive line.

According to one embodiment of the invention, the fabricating method of the semiconductor structure farther includes forming a lightly doped drain area disposed between the source and the channel and between the drain and the channel.

According to one embodiment of the invention, the material of the semiconductor layer can be poly-silicon.

According to one embodiment of the invention, the materials of the gate and the first electrode may be selected from molybdenum (Mo), tungsten molybdenum (MoW), chromium (Cr), titanium (Ti), aluminum (Al), copper (Cu), and a combination of the aforementioned.

According to one embodiment of the invention, the material of the patterned conductive layer may be indium tin oxide (ITO) or indium zinc oxide (IZO).

According to one embodiment of the invention, the second electrode and the source/drain conductive line may be a multi-layer metal structure constituted by titanium-aluminum-titanium (Ti—Al—Ti) or molybdenum-aluminum-molybdenum (Mo—Al—Mo).

According to one embodiment of the invention, the first inter-layer dielectric layer, the second inter-layer dielectric layer and the third inter-layer dielectric layer may be a multi-layer structure.

According to one embodiment of the invention, the materials of the first inter-layer dielectric layer, the second inter-layer dielectric layer and the third inter-layer dielectric layer may be selected from silicon nitride, silicon oxide, silicon oxynitride and a combination of the aforementioned.

According to one embodiment of the invention, the thickness of the first inter-layer dielectric layer may be 500-1,200 angstroms. The thickness of the second inter-layer dielectric layer may be 1,000-4,000 angstroms, and the thickness of the third inter-layer dielectric layer may be 1,000-4,000 angstroms.

The present invention further provides a semiconductor structure including a semiconductor layer, a first inter-layer dielectric layer, a gate, a first electrode, a second inter-layer dielectric layer, a patterned conductive layer, a third inter-layer dielectric layer, a plurality of contact windows, a second electrode, and a source/drain conductive line. The semiconductor layer is disposed on the substrate. The substrate has an active element area and a storage capacitor area. The semiconductor layer in the active element area includes a source, a drain and a channel disposed between the source and the drain. The first inter-layer dielectric layer covers the semiconductor layer. The gate is disposed on the first inter-layer dielectric layer in the active element area. The first electrode is disposed on the first inter-layer dielectric layer in the storage capacitor area. The gate, the source and the drain constitute an active element. The second inter-layer dielectric layer covers the gate and the first electrode. The patterned conductive layer is disposed on the second inter-layer dielectric layer and serves as a pixel electrode. The third inter-layer dielectric layer covers the patterned conductive layer. The contact windows are disposed in the first, second and third inter-layer dielectric layers so as to expose the patterned conductive layer, the source, the drain, and the first electrode. The second electrode and the source/drain conductive line are disposed on the third inter-layer dielectric layer. The second electrode is disposed over the first electrode and electrically connected to the first electrode. The source/drain conductive line electrically connects the semiconductor layer with the patterned conductive layer.

According to one embodiment of the invention, the semiconductor layer and the patterned conductive layer are electrically coupled as a first capacitor electrode. The first electrode and the second electrode are electrically coupled as a second capacitor electrode. The first capacitor electrode and the second capacitor electrode constitute a storage capacitor.

According to one embodiment of the invention, the semiconductor structure further includes a patterned protective layer covering the second electrode and the source/drain conductive line.

According to one embodiment of the invention, the patterned protective layer, the second electrode and the source/drain conductive line are formed by the same photomask to form the same pattern; or the patterned protective layer is formed by a photomask different from those of the second electrode and the source/drain conductive line to form different patterns.

According to one embodiment of the invention, the patterned conductive layer further includes a contact pad disposed on the periphery of the substrate so as to electrically connect the active element to other electronic elements.

According to one embodiment of the invention, the semiconductor structure further includes a lightly doped drain area. The lightly doped drain area is disposed between the source and the channel and between the drain and the channel.

According to one embodiment of the invention, the material of the semiconductor layer may be poly-silicon.

According to one embodiment of the invention, the materials of the gate and the first electrode may be selected from molybdenum (Mo), tungsten molybdenum (MoW), chromium (Cr), titanium (Ti), aluminum (Al), copper (Cu), and a combination of the aforementioned.

According to one embodiment of the invention, the material of the patterned conductive layer may be indium tin oxide (ITO) or indium zinc oxide (IZO).

According to one embodiment of the invention, the second electrode and the source/drain conductive line may be a multi-layer metal structure constituted by Ti—Al—Ti or Mo—Al—Mo.

According to one embodiment of the invention, the first inter-layer dielectric layer, the second inter-layer dielectric layer and the third inter-layer dielectric layer may be a multi-layer structure.

According to one embodiment of the invention, the materials of the first inter-layer dielectric layer, the second inter-layer dielectric layer and the third inter-layer dielectric layer may be selected from silicon nitride, silicon oxide, silicon oxynitride and a combination of the aforementioned.

According to one embodiment of the invention, the thickness of the first inter-layer dielectric layer may be 500-1,200 angstroms. The thickness of the second inter-layer dielectric layer may be 1,000-4,000 angstroms, and the thickness of the third inter-layer dielectric layer may be 1,000-4,000 angstroms.

The present invention further provides a pixel structure. The pixel structure is suitable for being disposed on a substrate, and includes an active element and a multi-layer storage capacitor. The multi-layer storage capacitor is electrically connected to the active element, and the multi-layer storage capacitor includes a semiconductor layer, a first electrode, a pixel electrode, and a second electrode. The semiconductor layer is disposed on the substrate. The first electrode is disposed over the semiconductor layer. The pixel electrode is disposed over the first electrode. The second electrode is disposed over the pixel electrode. The semiconductor layer and the pixel electrode are electrically coupled as a first capacitor electrode. The first electrode and the second electrode are electrically coupled as a second capacitor electrode. The first capacitor electrode and the second capacitor electrode constitute the multi-layer storage capacitor.

According to one embodiment of the invention, the active element may be a low temperature poly-silicon thin film transistor (LTPS-TFT).

According to one embodiment of the invention, the pixel structure further includes a patterned protective layer covering the second electrode.

According to one embodiment of the invention, the patterned protective layer, the second electrode and the source/drain conductive line are formed by the same photomask to from the same pattern; or the patterned protective layer is formed by a photomask different from those of the second electrode and the source/drain conductive line to form different patterns.

According to one embodiment of the invention, the pixel structure further includes a contact pad disposed on the periphery of the substrate. The contact pad and the pixel electrode are made of the same material and formed in the same step. The active element is electrically connected to other electronic elements through the contact pad.

According to one embodiment of the invention, the material of the semiconductor layer may be poly-silicon.

According to one embodiment of the invention, the material of the first electrode may be selected from molybdenum (Mo), tungsten molybdenum, chromium (Cr), titanium (Ti), aluminum (Al), copper (Cu), and a combination of the aforementioned.

According to one embodiment of the invention, the material of the pixel electrode may be indium tin oxide (ITO) or indium zinc oxide (IZO).

According to one embodiment of the invention, the second electrode may be a multi-layer metal structure constituted by Ti—Al—Ti or Mo—Al—Mo.

According to one embodiment of the invention, the pixel structure further includes the first inter-layer dielectric layer, the second inter-layer dielectric layer, and the third inter-layer dielectric layer. The first inter-layer dielectric layer is disposed between the semiconductor layer and the first electrode. The second inter-layer dielectric layer is disposed between the first electrode and the pixel electrode. The third inter-layer dielectric layer is disposed between the pixel electrode and the second electrode.

According to one embodiment of the invention, the first inter-layer dielectric layer, the second inter-layer dielectric layer and the third inter-layer dielectric layer may be a multi-layer structure.

According to one embodiment of the invention, the materials of the first inter-layer dielectric layer, the second inter-layer dielectric layer and the third inter-layer dielectric layer may be selected from silicon nitride, silicon oxide, silicon oxynitride and a combination of the aforementioned.

According to one embodiment of the invention, the thickness of the first inter-layer dielectric layer may be 500-1,200 angstroms. The thickness of the second inter-layer dielectric layer may be 1,000-4,000 angstroms, and the thickness of the third inter-layer dielectric layer may be 1,000-4,000 angstroms.

The present invention further provides a liquid crystal display (LCD) panel including a TFT array substrate, a color filter substrate and a liquid crystal layer. The TFT array substrate includes a plurality of pixel structures, wherein each of the pixel structures includes an active element and a multi-layer storage capacitor. The multi-layer storage capacitor is electrically connected to the active element and includes a semiconductor layer, a first electrode, a pixel electrode and a second electrode. The semiconductor layer is disposed on the TFT array substrate. The first electrode is disposed over the semiconductor layer. The pixel electrode is disposed over the first electrode. The second electrode is disposed over the pixel electrode. The semiconductor layer and the pixel electrode are electrically coupled as a first capacitor electrode. The first electrode and the second electrode are electrically coupled as a second capacitor electrode. The first capacitor electrode and the second capacitor electrode constitute the multi-layer storage capacitor. The color filter substrate is disposed opposite to the TFT array substrate. The liquid crystal layer is disposed between the TFT array substrate and the color filter substrate.

In one embodiment of the invention, the color filter substrate includes a substrate, a color filter layer and a common electrode. The color filter layer is disposed on the substrate. The common electrode is disposed on the color filter layer and opposite to the pixel electrode.

The method for fabricating the semiconductor structure of the invention requires only five photomasks. Compared to the prior art, there are less photomasks so the fabricating cost is thus reduced. Furthermore, the fabricated semiconductor structure and the pixel structure have multi-layer storage capacitors and thereby substantially increasing the storage capacitance. In addition, an LCD panel equipped with the pixel structure of the present invention has a better frame display quality.

In order to make the aforementioned and other objects, features and advantages of the present invention more comprehensible, preferred embodiments accompanied with figures are described in detail below.

BRIEF DESCRIPTION OF THE DRAWINGS

FIGS. 2A to 2G are schematic cross-sectional views illustrating a fabricating method of a semiconductor structure according to one preferred embodiment of the present invention.

DESCRIPTION OF EMBODIMENTS

Figure 1A:
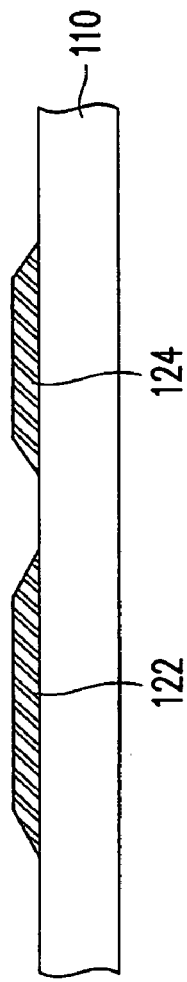
FIGS. 1A-1F are schematic cross-sectional views illustrating a conventional fabricating process of a pixel structure having a low temperature poly-silicon thin film transistor (LTPS-TFT) and a storage capacitor.
Figure 1B:
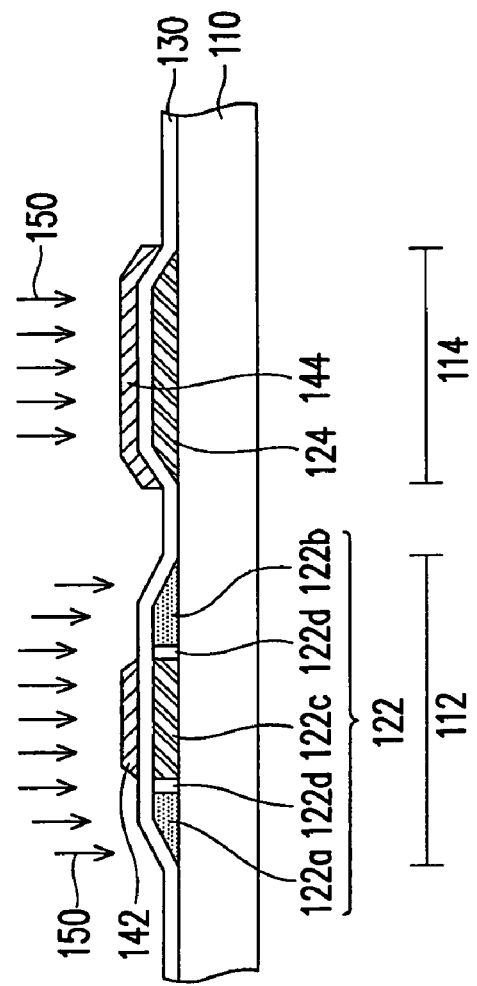
Figure 1C:
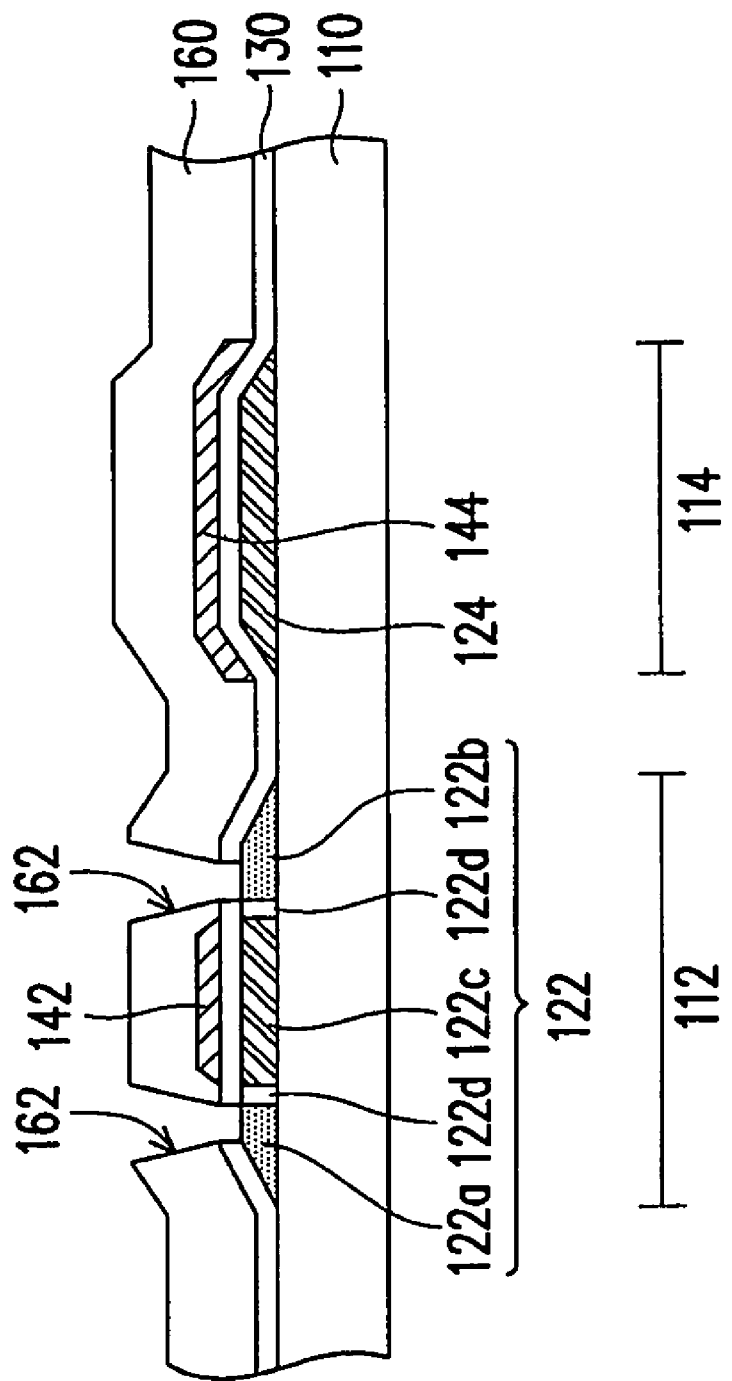
Figure 1D:
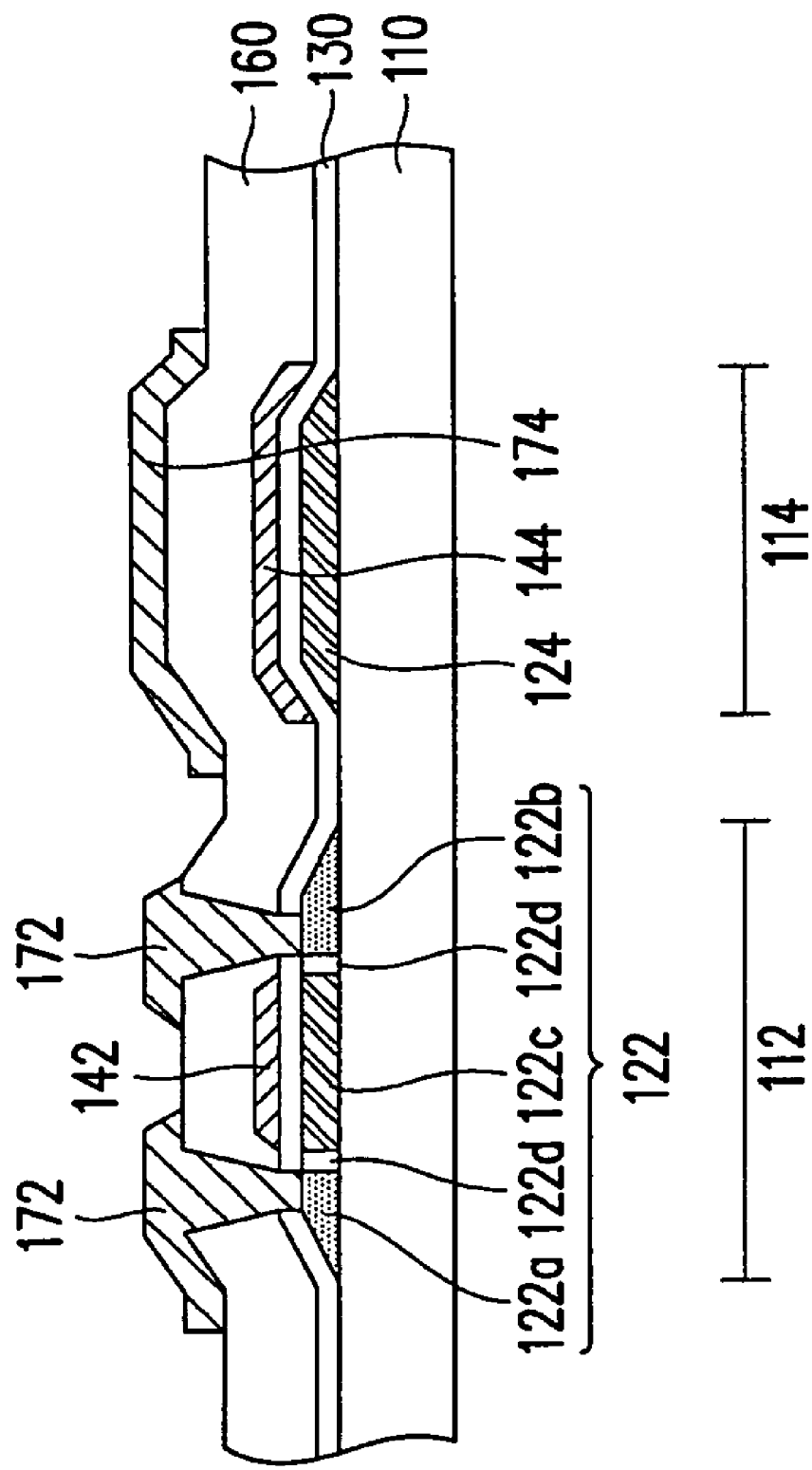
Figure 1E:
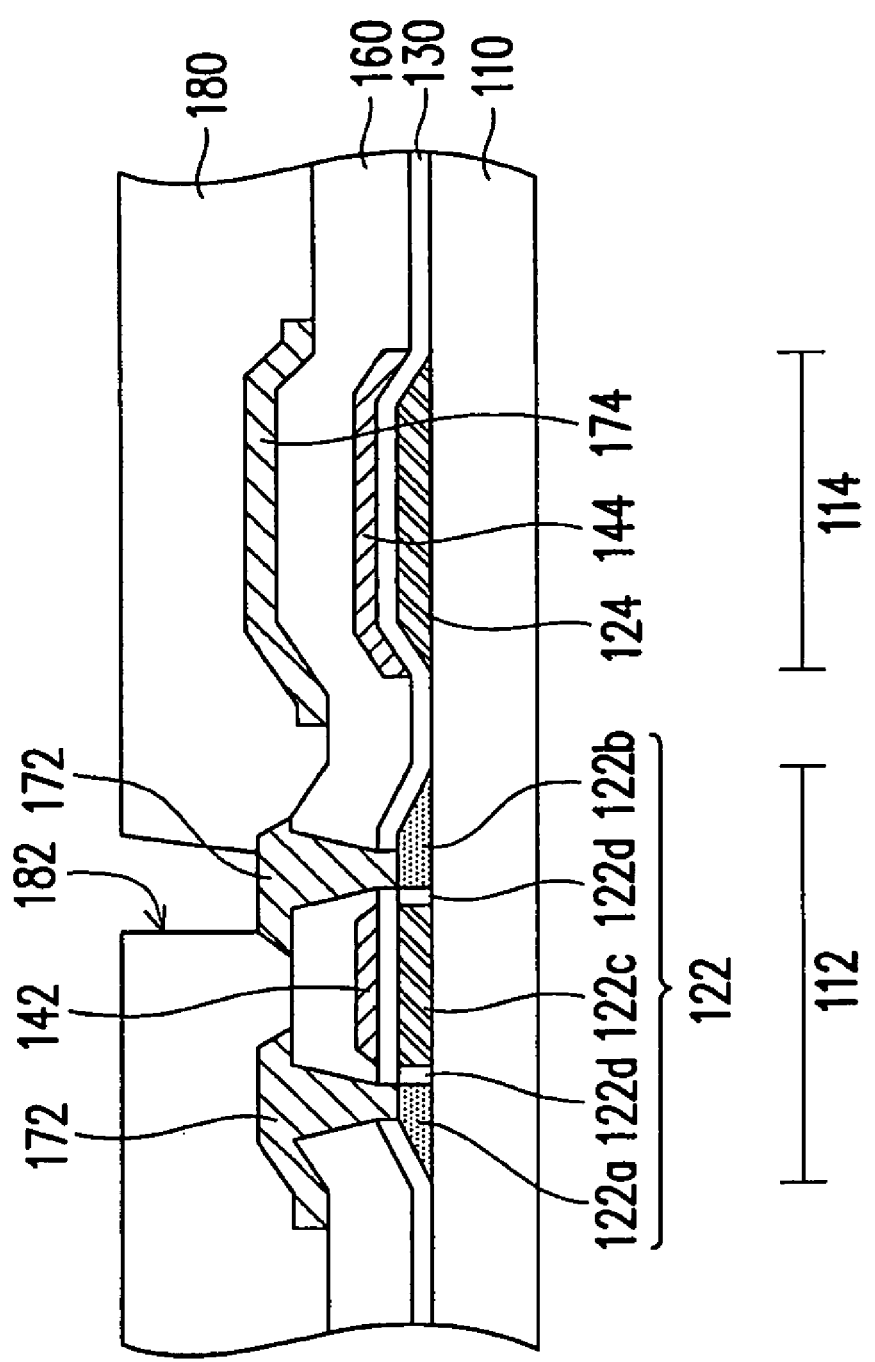
Figure 1F:
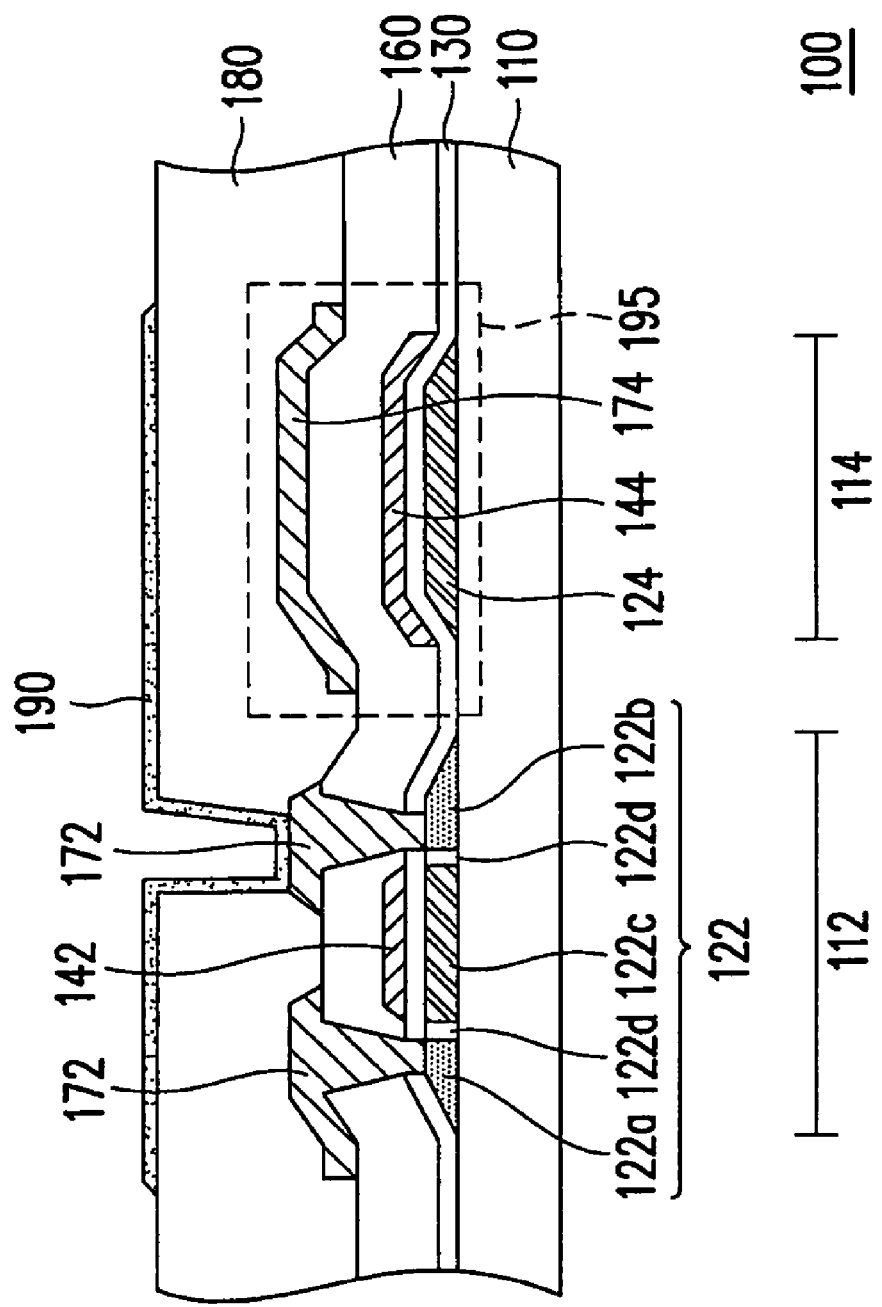

In order to mitigate the problem of insufficient storage capacitance and reduce the number of photomasks during the fabrication process of a semiconductor structure, provided as follows is a method for fabricating a semiconductor structure and a semiconductor structure, a pixel structure and an LCD panel thus obtained according to preferred embodiments of the present invention. However, the following illustrations are simply some preferred embodiments of the present invention and should not be used to limit the scope of the invention.

The Fabricating Method of Semiconductor Structure

FIGS. 2A to 2G are schematic cross-sectional views illustrating a fabricating method of a semiconductor structure according to one preferred embodiment of the invention.

Referring to FIG. 2A first, a semiconductor layer 220 is formed on a substrate 210. The semiconductor layer 220 is disposed in an active element area 212 and a storage capacitor area 214 of the substrate 210. The substrate 210 may be a glass substrate or a quartz substrate. The method for forming the semiconductor layer 220 may be as follows. First, a chemical vapor deposition (CVD) process is performed to form a semiconductor material layer (not illustrated) on the substrate 210. Then, a first photomask (not illustrated) is used to pattern the semiconductor material layer so as to obtain the semiconductor layer 220. Moreover, the material of the semiconductor layer 220 may be poly-silicon, amorphous silicon or doped poly-silicon.

Referring to FIG. 2A, a buffer layer 216 may be optionally formed first on the substrate 210 before forming the semiconductor layer 220. The buffer layer 216 can prevent the impurities of the substrate 210 from polluting the semiconductor layer 220 in the subsequent fabricating process. Additionally, the adhesion between the semiconductor layer 220 and the substrate 210 can be enhanced. The material of the buffer layer 216 may be silicon nitride (SiN), silicon oxide (SiOx) or a combination of the aforementioned.

Next, referring to FIG. 2B, a first inter-layer dielectric layer 230 is formed to cover the semiconductor layer 220. The method for forming the first inter-layer dielectric layer 230 may be a chemical vapor deposition (CVD) process. Furthermore, the first inter-layer dielectric layer 230 may be a multi-layer structure which is formed by stacking layers of different materials on one another. The material of the first inter-layer dielectric layer 230 may be selected from silicon nitride, silicon oxide, silicon oxynitride (SiON) and a combination of the aforementioned. Besides, the thickness of the first inter-layer dielectric layer 230 may be 500-1,200 angstroms so as to facilitate formation of a good storage capacitor.

Still referring to FIG. 2B, a gate 242 is formed on the first inter-layer dielectric layer 230 in the active element area 212, and a first electrode 244 is formed on the first inter-layer dielectric layer 230 in the storage capacitor area 214. The method for forming the gate 242 and the first electrode 244 may be forming a first conductive material layer (not illustrated) on the first inter-layer dielectric layer 230 first. Then, a second photomask is used to pattern the first conductive material layer and thus obtain the gate 242 and the first electrode 244. Moreover, the materials of the gate 242 and the first electrode 244 may be selected from molybdenum (Mo), tungsten molybdenum (MoW), chromium (Cr), titanium (Ti), aluminum (Al), copper (Cu), and a combination of the aforementioned. The combination can be an alloy or a stacked layer structure so that the gate 242 and the first electrode 244 can have good conductivity.

Figure 2C:
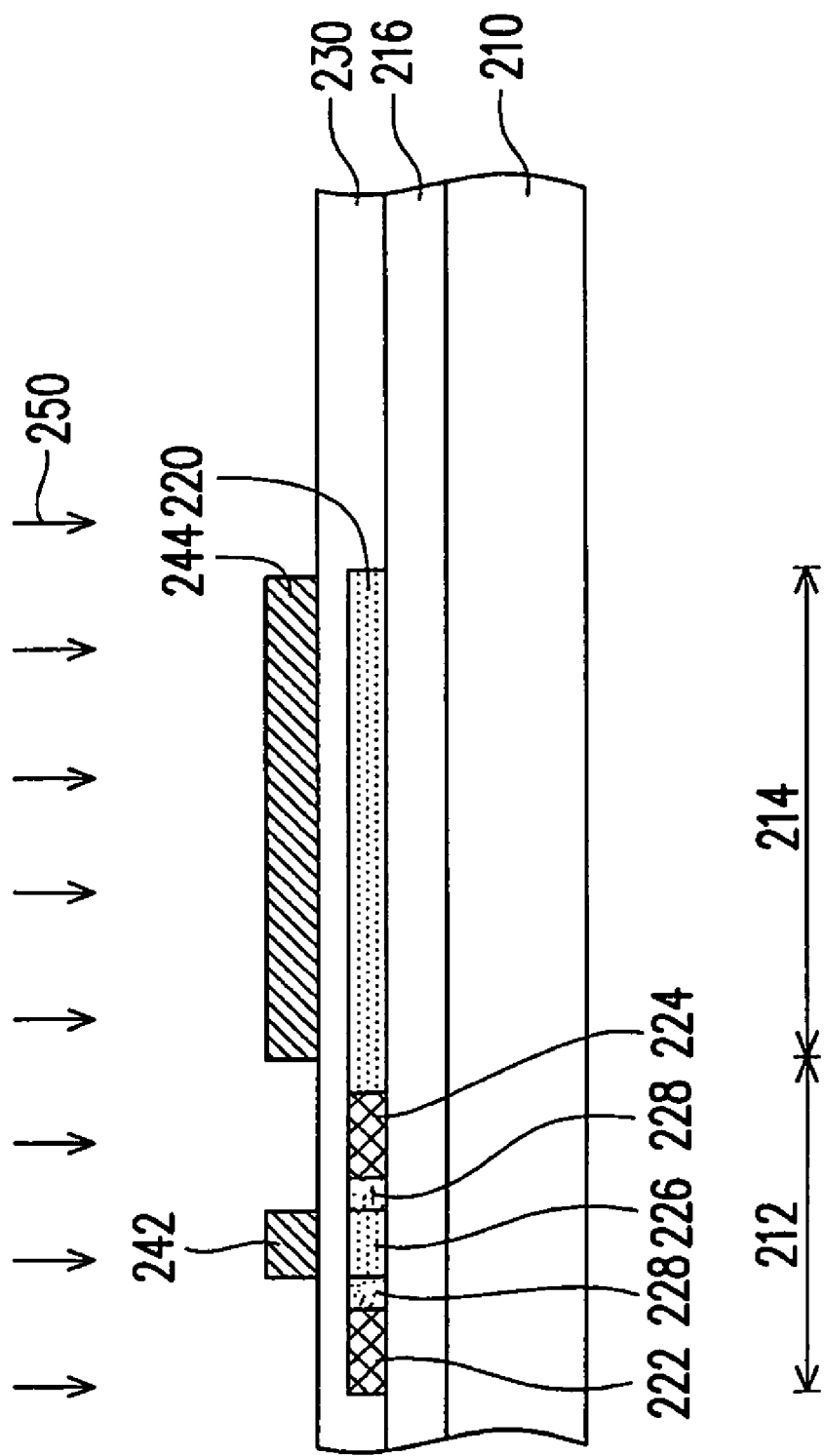

Referring to FIG. 2C, a doping process 250 is performed to form a source 222 and a drain 224 in the semiconductor layer 220 that is in the active element area 212. The area between the source 222 and the drain 224 is a channel 226. The doping process 250 may be a self-aligned doping process, which means utilizing the gate 242 as the self-alignment mask to dope the semiconductor layer 220 in the active element area 212. Doped ions may be P-type dopant or N-type dopant.

Still referring to FIG. 2C, a lightly doped drain area 228 can be further formed between the source 222 and the channel 226 and between the drain 224 and the channel 226. The method for forming the lightly doped drain area 228 may be first etching a distance from the two ends of the gate 242 toward the center thereof, and then performing another doping process (not illustrated) to implant the dopant between the source 222 and the channel 226 and between the drain 224 and the channel 226.

Figure 2D:
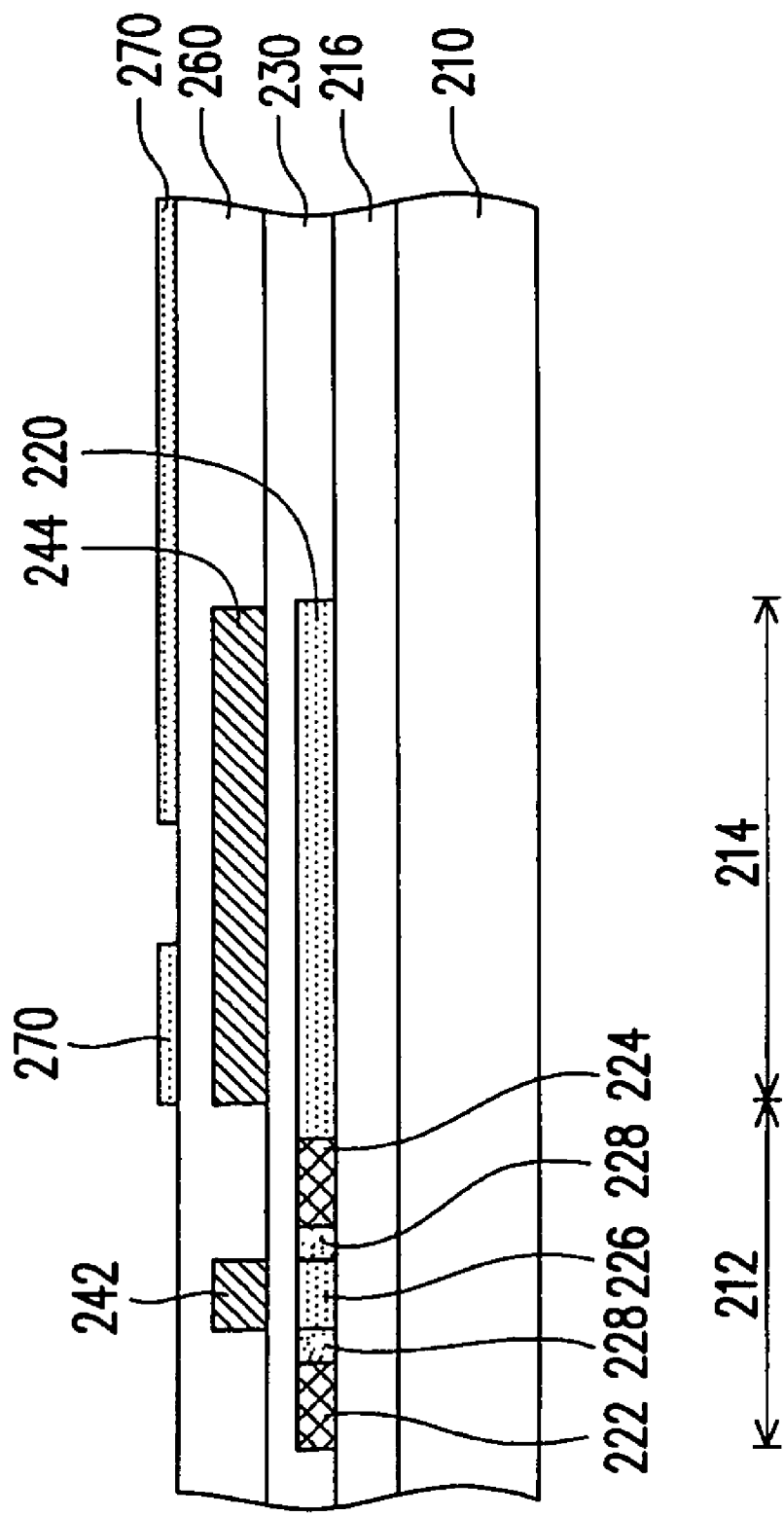

Referring to FIG. 2D, a second inter-layer dielectric layer 260 is formed to cover the gate 242 and the first electrode 244. The method for forming the second inter-layer dielectric layer 260 may be performing a chemical vapor deposition (CVD) process. Similarly, the second inter-layer dielectric layer 260 may be a multi-layer structure which is formed by stacking layers of different materials on one another. The materials of the second inter-layer dielectric layer 260 may be selected from silicon nitride, silicon oxide, silicon oxynitride and a combination of the aforementioned. Besides, the thickness of the second inter-layer dielectric layer 260 may be 1,000-4,000 angstroms so as to facilitate formation of a good storage capacitor.

Referring to FIG. 2D, a patterned conductive layer 270 is formed on the second inter-layer dielectric layer 260 as a pixel electrode. The method for forming the patterned conductive layer 270 may be performing a sputtering process to form a transparent conductive layer (not illustrated) on the second inter-layer dielectric layer 260 first. Then, a third photomask (not illustrated) is used to pattern the transparent conductive layer to obtain the patterned conductive layer 270. Additionally, the material of the patterned conductive layer 270 may be indium tin oxide (ITO) or indium zinc oxide (IZO).

Figure 2E:
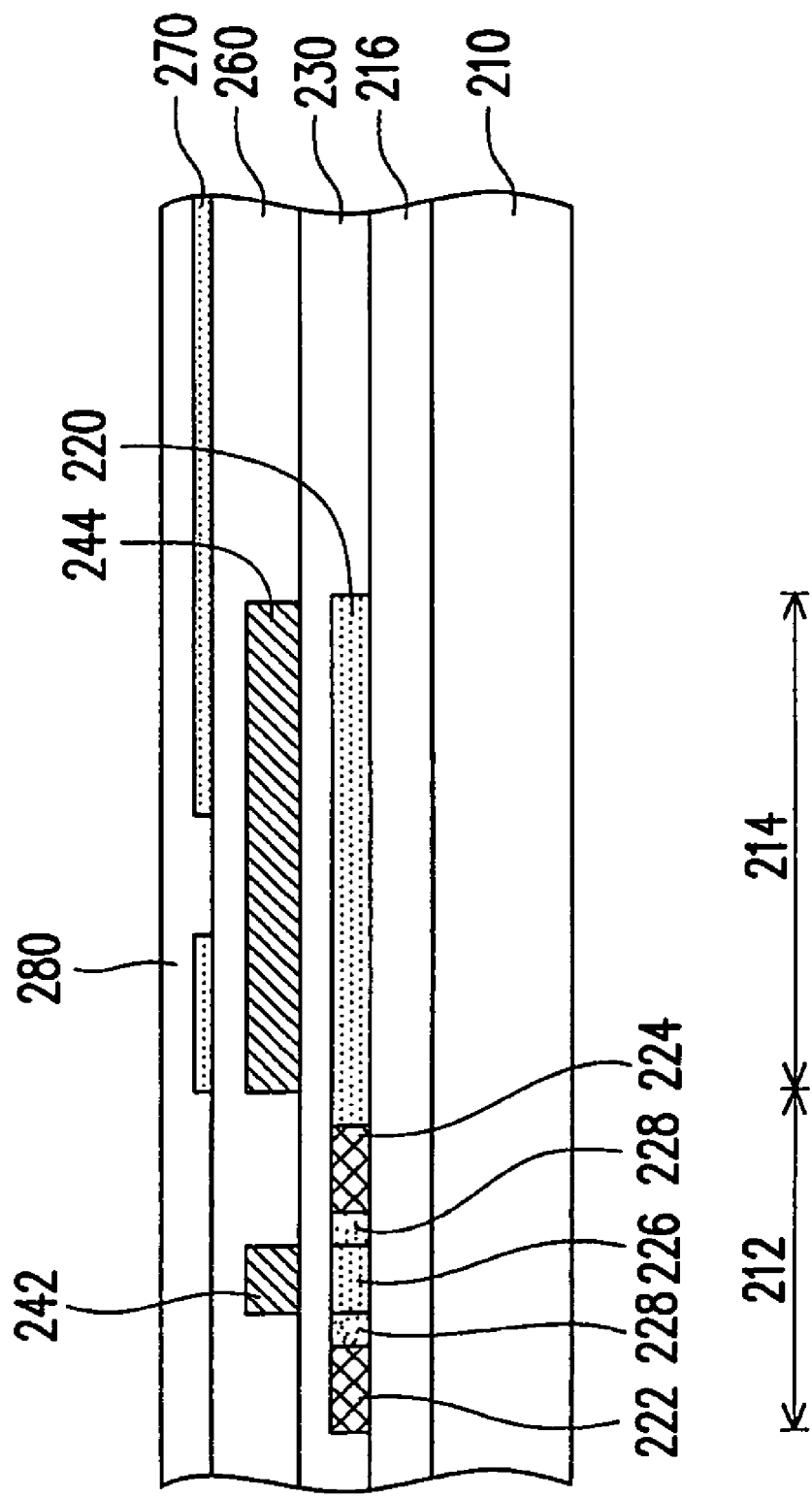

Next, referring to FIG. 2E, a third inter-layer dielectric layer 280 is formed to cover the patterned conductive layer 270. The method for forming the third inter-layer dielectric layer 280 may be performing a chemical vapor deposition (CVD) process. Similarly, the third inter-layer dielectric layer 280 may be a multi-layer structure which is formed by stacking layers of different materials on one another. The materials of the third inter-layer dielectric layer 280 may be selected from silicon nitride, silicon oxide, silicon oxynitride and a combination of the aforementioned. Besides, the thickness of the third inter-layer dielectric layer 280 may be 1,000-4,000 angstroms so as to facilitate formation of a good storage capacitor.

Figure 2F:
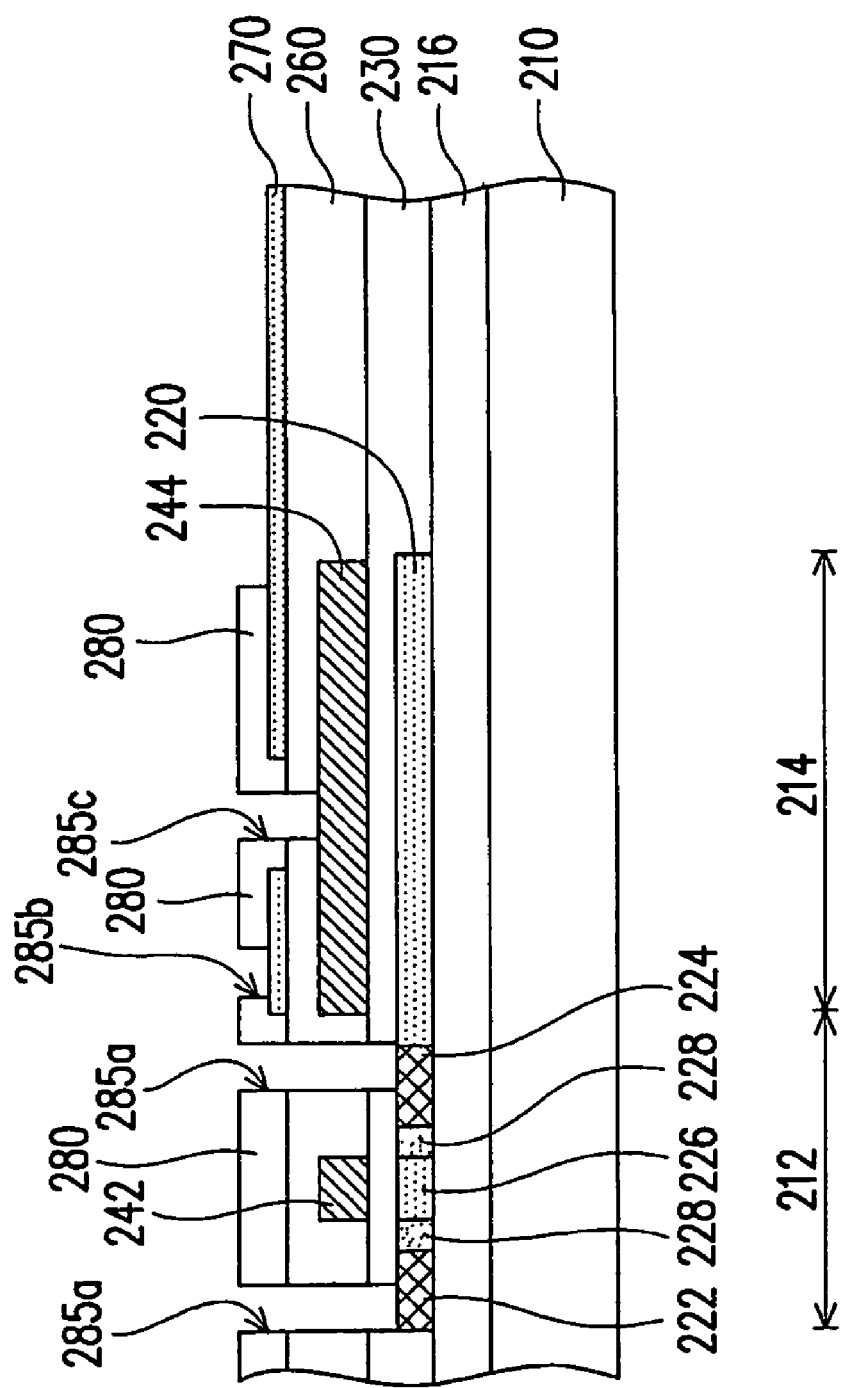

Referring to FIG. 2F, the third inter-layer dielectric layer 280 is patterned to expose the patterned conductive layer 270. A plurality of contact windows 285a, 285b and 285c are formed in the first, second and third inter-layer dielectric layers 230, 260 and 280 to expose the source 222, the drain 224, a portion of the patterned conductive layer 270, and the first electrode 244. Especially, in this step, a fourth photomask is used to perform a patterning process and fabricate the patterned third inter-layer dielectric layer 280.

More particularly, the first, second and third inter-layer dielectric layers 230, 260 and 280 can be multi-layer structures, which means each of the layers may be constituted by different materials. With the pattern design of the fourth photomask and the different etching selectivity ratios of different materials, each of the fabricated contact windows 285a, 285b and 285c thus has a different depth so that the source 222, the drain 224, a portion of the patterned conductive layer 270 and the first electrode 244 are respectively exposed.

Figure 2G:
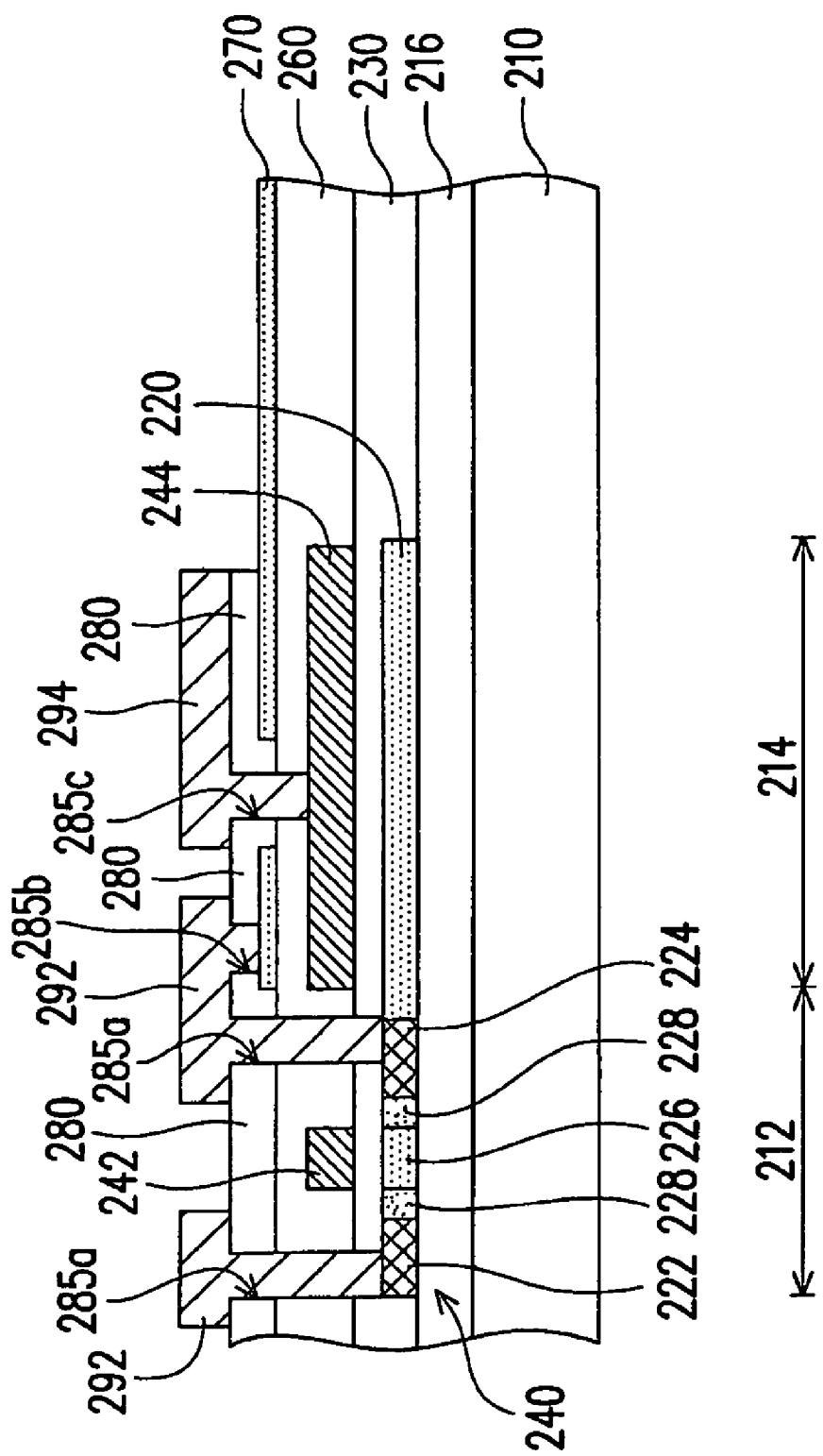

Furthermore, referring to FIG. 2G, a second electrode 294 is formed on the third inter-layer dielectric layer 280. The second electrode 294 is disposed over the first electrode 244 and electrically connected to the first electrode 244, and a source/drain conductive line 292 is also formed to electrically connect the semiconductor layer 220 with the patterned conductive layer 270. The method for forming the second electrode 294 and the source/drain conductive line 292 may be forming a second conductive material layer (not illustrated) on the third inter-layer dielectric layer 280 first. Then, a fifth photomask is used to pattern the second conductive material layer and obtain the source/drain conductive line 292 and the second electrode 294. In addition, the second electrode 294 and the source/drain conductive line 292 can be a multi-layer metal structure constituted by Ti—Al—Ti or Mo—Al—Mo so as to elevate the conductivity of thereof.

Moreover, a patterned protective layer 300 (referring to FIG. 3) can be formed on the second electrode 294 and the source/drain conductive line 292 so as to prevent the second electrode 294 and the source/drain conductive line 292 from being damaged. The patterned protective layer 300, the second electrode 294 and the source/drain conductive line 292 may be formed by the same photomask to form the same pattern. Alternatively, each of the patterned protective layer 300, the second electrode 294 and the source/drain conductive line 292 can be formed by their own photomasks to form different patterns.

Through the steps illustrated in FIGS. 2A-2G, a semiconductor structure 200 having a multi-layer storage capacitor is obtained. More particularly, the fabricating method of the semiconductor structure 200 requires only five photomasks such that the fabrication cost can be lowered. The semiconductor structure 200 is further described in the following.

The Semiconductor Structure

Referring to FIG. 2G again, the semiconductor structure 200 includes a semiconductor layer 220, a first inter-layer dielectric layer 230, a gate 242, a first electrode 244, a second inter-layer dielectric layer 260, a patterned conductive layer 270, a third inter-layer dielectric layer 280, a plurality of contact windows 285a, 285b and 285c, a second electrode 294, and a source/drain conductive line 292.

As shown in FIG. 2G, the semiconductor layer 220 is disposed on the substrate 210. The substrate 210 has an active element area 212 and a storage capacitor area 214. The semiconductor layer 220 in the active element area 212 includes a source 222, a drain 224 and a channel 226 disposed between the source 222 and the drain 224. The first inter-layer dielectric layer 230 covers the semiconductor layer 220. The gate 242 is disposed on the first inter-layer dielectric layer 230 in the active element area 212, and the first electrode 244 is disposed on the first inter-layer dielectric layer 230 in the storage capacitor area 214. The gate 242, the source 222 and the drain 224 constitute an active element 240. The second inter-layer dielectric layer 260 covers the gate 242 and the first electrode 244. The patterned conductive layer 270 is disposed on the second inter-layer dielectric layer 260 and serves as a pixel electrode. The third inter-layer dielectric layer 280 covers the patterned conductive layer 270. The contact windows 285a, 285b and 285c are disposed in the first, second and third inter-layer dielectric layers 230, 260 and 280 so as to expose the patterned conductive layer 270, the source 222, the drain 224, and the first electrode 244. The second electrode 294 and the source/drain conductive line 292 are disposed on the third inter-layer dielectric layer 280. The second electrode 294 is disposed over the first electrode 244 and electrically connected to the first electrode 244. The source/drain conductive line 292 electrically connects the semiconductor layer 220 and the patterned conductive layer 270.

In the semiconductor structure 200, a buffer layer 216 may also be formed between the substrate 210 and the semiconductor layer 220 so as to prevent the impurities of the substrate 210 from polluting the semiconductor layer 220.

It should be noted that the semiconductor layer 220 and the patterned conductive layer 270 are electrically coupled as a first capacitor electrode. The first electrode 244 and the second electrode 294 are electrically coupled as a second capacitor electrode. The first capacitor electrode and the second capacitor electrode constitute a storage capacitor.

Referring to FIG. 2G, more specifically, with the dispositions of the contact windows 285a and 285b, the semiconductor layer 220 is electrically connected to the patterned conductive layer 270 through the source/drain conductive line 292. Therefore, the semiconductor layer 220 and the patterned conductive layer 270 have the same electrical potential.

Moreover, the first electrode 244 and the second electrode 294 are electrically connected through the contact window 285c. Hence, the first electrode 244 and the second electrode 294 have the same electrical potential.

It can be known from the structure of the storage capacitor in the storage capacitor area 214 of the substrate 210, i.e., the semiconductor layer 220, the first inter-layer dielectric layer 230 and the first electrode 244 constitute a first layer capacitor. The first electrode 244, the second inter-layer dielectric layer 260 and the patterned conductive layer 270 (i.e. the pixel electrode) constitute a second layer capacitor. The patterned conductive layer 270, the third inter-layer dielectric layer 280 and the second electrode 294 constitute a third layer capacitor.

In view of the above, the semiconductor structure 200 has a multi-layer storage capacitor. As shown in FIG. 2C, even if the semiconductor layer 220 in the storage capacitor area 214 isn't doped during the doping process 250, the fabricated semiconductor structure 200 still has a large storage capacitance.

The material and the thickness of each layer in the semiconductor structure 200 have already been described in previous fabricating method and thus are not to be reiterated herein.

Figure 3:
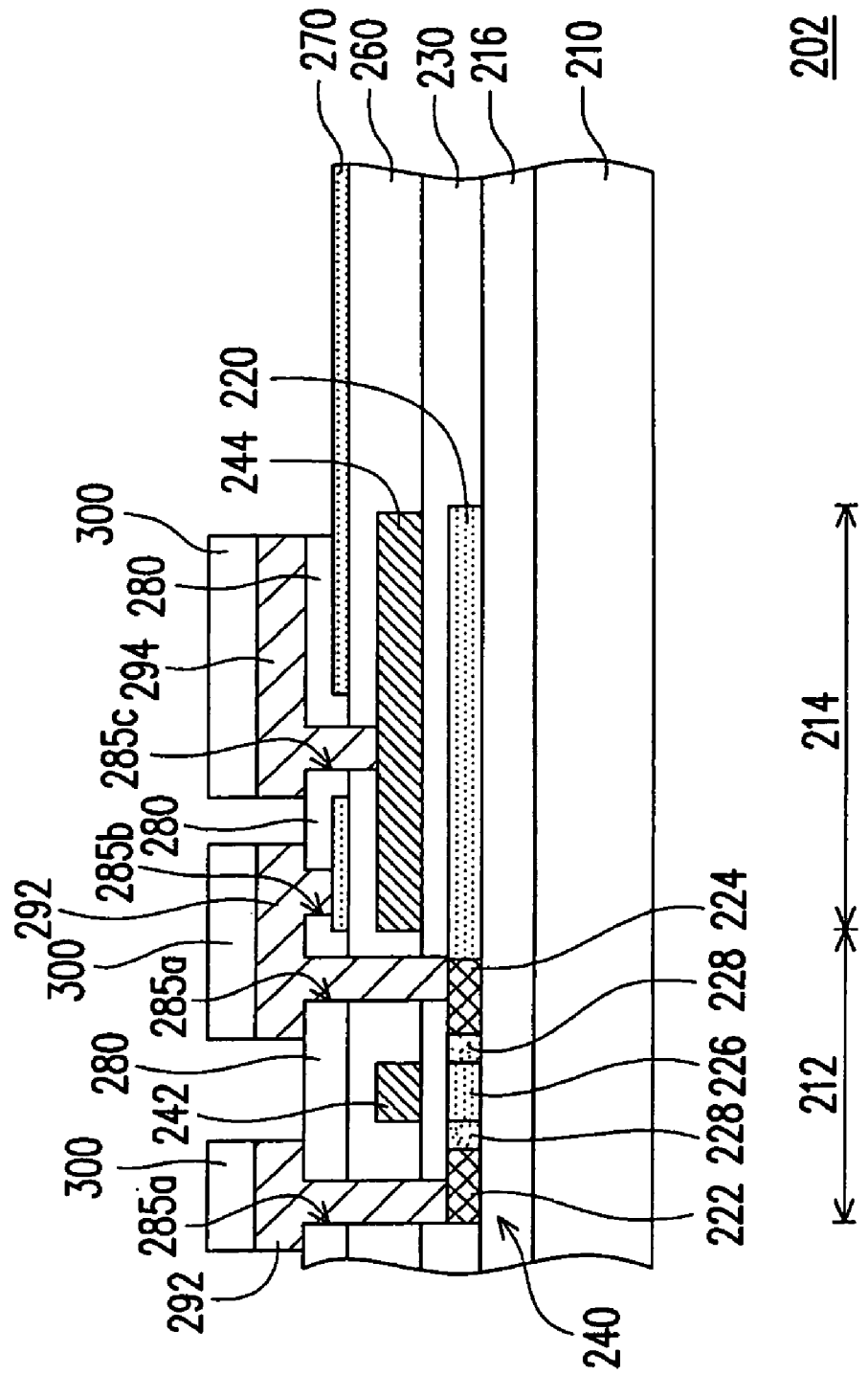
FIG. 3 is a schematic cross-sectional view illustrating another semiconductor structure according to one preferred embodiment of the invention.

FIG. 3 is a schematic cross-sectional view illustrating another semiconductor structure according to one preferred embodiment of the invention. Referring to FIG. 3, a semiconductor structure 202 is similar to the semiconductor structure 200 illustrated in FIG. 2G. Similar elements are marked with the same reference numerals and characters. The only difference between the two semiconductor structures 200, 202 is that the semiconductor structure 202 of FIG. 3 further includes a patterned protective layer 300.

In more detail, the semiconductor structure 202 may further include the patterned protective layer 300 covering the second electrode 294 and the source/drain conductive line 292. Thus, the second electrode 294 and the source/drain conductive line 292 can be prevented from being damaged. The patterned protective layer 300, the second electrode 294 and the source/drain conductive line 292 are formed by the same photomask to form the same pattern. Alternatively, each of the patterned protective layer 300, the second electrode 294 and the source/drain conductive line 292 may be formed by their own photomasks to form different patterns.

In addition, the semiconductor structure 200 as shown in FIG. 2G may further pull lead lines from the source/drain conductive line 292. And, the lead lines may be data lines (not illustrated) so as to electrically connect the active element 240 to other electronic elements (the contact pad, for example). In the semiconductor structure 202 of FIG. 3, the lead lines cannot directly be pulled from the source/drain conductive line 292. However, the source/drain conductive line 292 is electrically connected to the patterned conductive layer 270, so that the active element 240 can be electrically connected to other electronic elements through the contact pad constituted by the patterned conductive layer 270.

Figure 4:
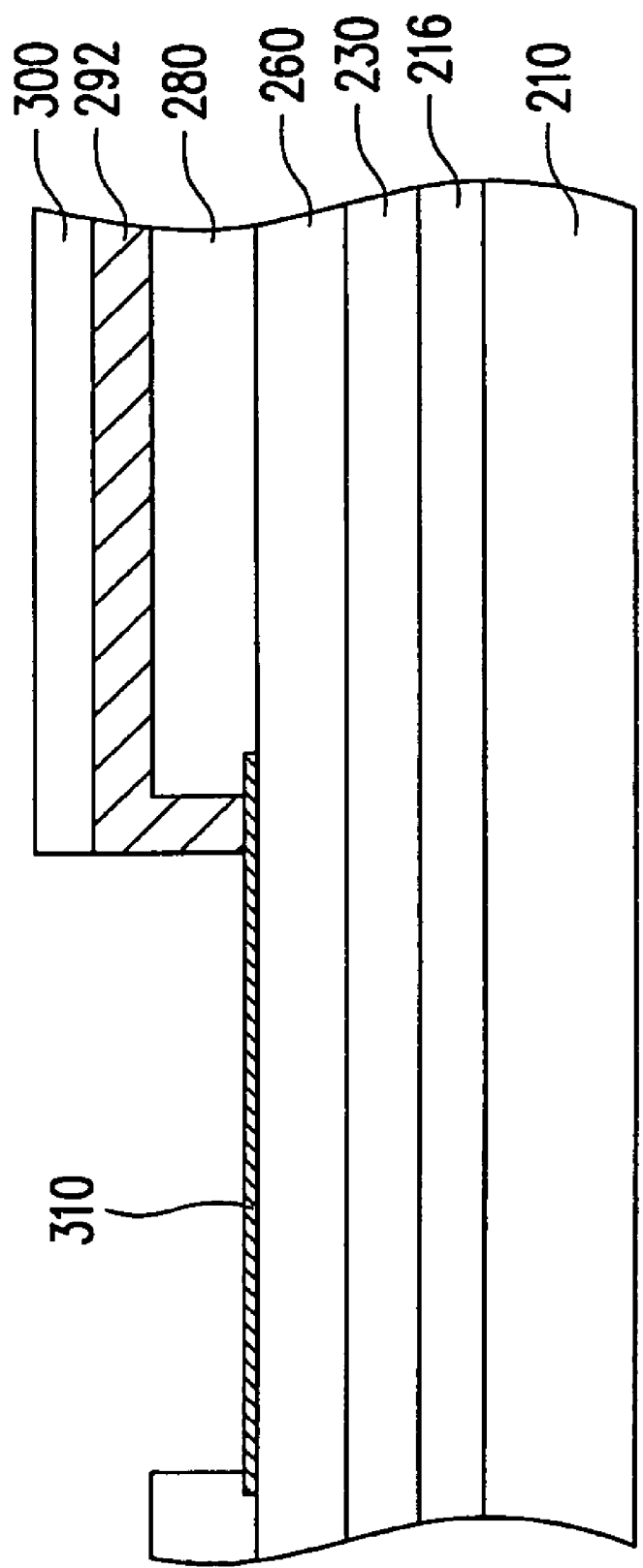
FIG. 4 is a schematic cross-sectional view illustrating the contact pad constituted by a patterned conductive layer electrically connecting an active element to other electronic elements.

FIG. 4 is a schematic cross-sectional view illustrating the contact pad constituted by the patterned conductive layer electrically connecting the active element to other electronic elements. Referring to both FIGS. 3 and 4, the semiconductor structure 202 may further include a contact pad 310. The contact pad 310 is disposed on the periphery of the substrate 210 and made of the same material as the patterned conductive layer 270, and both layers are fabricated in the same step. Therefore, the disposition of the patterned protective layer 300 does not affect the subsequent fabrication process of the semiconductor structure 202.

Both the semiconductor structures 200 and 202 have a multi-layer storage capacitor and thus can significantly increase the storage capacitance. If applied in a display device, the semiconductor structure 200 or 202 can serve as the pixel structure thereof to perform the displaying operation of the frame. The description of the pixel structure and the LCD panel having the same continues in the following.

LCD Panel

Figure 5:
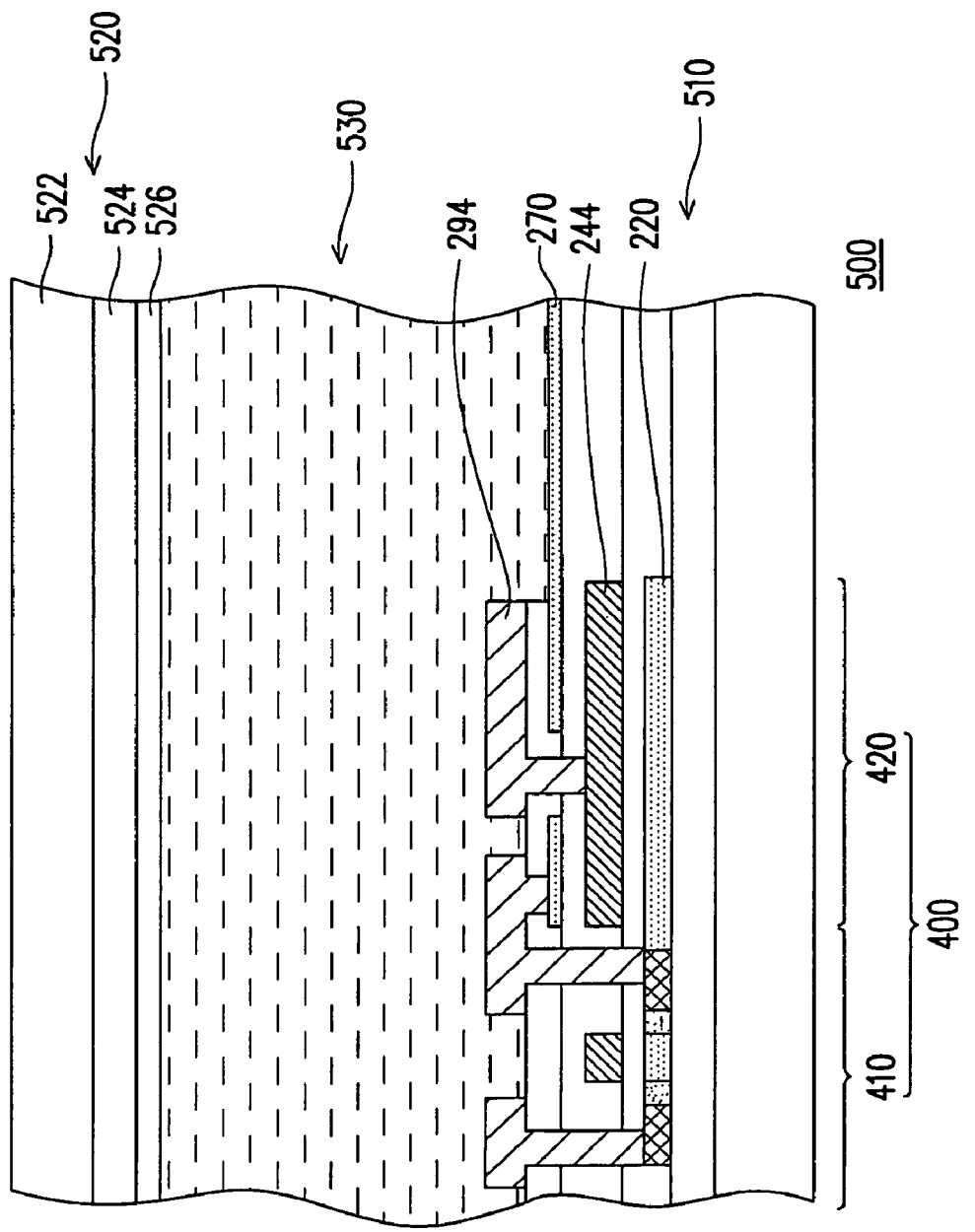
FIG. 5 is a schematic cross-sectional view illustrating an LCD panel according to one preferred embodiment of the invention.

FIG. 5 is a schematic cross-sectional view illustrating an LCD panel according to one preferred embodiment of the invention. Referring to FIG. 5, an LCD panel 500 includes a TFT array substrate 510, a color filter substrate 520 and a liquid crystal layer 530. The TFT array substrate 510 includes a plurality of pixel structures 400, wherein each of the pixel structures 400 includes an active element 410 and a multi-layer storage capacitor 420. Elements in the pixel structure 400 that are the same as those in the semiconductor structures 200 and 202 are marked with the same reference numerals and characters.

The multi-layer storage capacitor 420 is electrically connected to the active element 410, and the multi-layer storage capacitor 420 includes the semiconductor layer 220, the first electrode 244, the pixel electrode 270, and the second electrode 294. The semiconductor layer 220 is disposed on the TFT array substrate 510. The first electrode 244 is disposed over the semiconductor layer 220. The pixel electrode 270 is disposed over the first electrode 244. The second electrode 294 is disposed over the pixel electrode 270. The semiconductor layer 220 and the pixel electrode 270 are electrically coupled as a first capacitor electrode. The first electrode 244 and the second electrode 294 are electrically coupled as a second capacitor electrode. The first capacitor electrode and the second capacitor electrode constitute the multi-layer storage capacitor 420. The color filter substrate 520 is disposed opposite to the TFT array substrate 510. The liquid crystal layer 530 is disposed between the TFT array substrate 510 and the color filter substrate 520.

The structure of the pixel structure 400 is similar to those of the semiconductor structures 200 and 202 and thus not to be reiterated herein. The pixel structure 400 has the multi-layer storage capacitor 420 and therefore has a large storage capacitance, which renders the frame display more stable, in other words, the LCD panel 500 has a better display quality.

The color filter substrate 520 may include a substrate 522, a color filter layer 524 and a common electrode 526. The color filter layer 524 is disposed on the substrate 522. The common electrode 526 is disposed on the color filter layer 524 and opposite to the pixel electrode 270. With the operation of the active element 410, a voltage difference can be generated between the pixel electrode 270 and the common electrode 526 so as to tilt the liquid crystal molecules in the liquid crystal layer 530 and display the frame.

Pixel Structure

The present invention further provides the pixel structure 400 as illustrated in FIG. 5. The detailed structure thereof has been previously described and is not to be reiterated herein. More particularly, the pixel structure 400 is applied not only in the LCD panel 500 but also in the organic electro-luminescence display (OLED), the plasma display panel (PDP) or other display devices.

Referring to FIG. 5, the active element 410 may be an LTPS-TFT and thereby increasing the operation speed and stability thereof. Likewise, the pixel structure 400 may further include a patterned protective 300 covering the second electrode 294 as the semiconductor structure 202 of FIG. 3.

With the patterned protective layer 300, the electrical connection between the active element 410 and the outer electronic elements would not be affected. In other words, the contact pad 310 constituted by the patterned conductive layer 270 can be utilized to electrically connect the active element 240 to other electronic elements as shown in FIG. 4.

The pixel structure 400 further includes the first inter-layer dielectric layer 230, the second inter-layer dielectric layer 260 and the third inter-layer dielectric layer 280. The first inter-layer dielectric layer 230 is disposed between the semiconductor layer 220 and the first electrode 244. The second inter-layer dielectric layer 260 is disposed between the first electrode 244 and the pixel electrode 270. The third inter-layer dielectric layer 280 is disposed between the pixel electrode 270 and the second electrode 294.

That means, the semiconductor layer 220, the first inter-layer dielectric layer 230 and the first electrode 244 constitute the first layer capacitor. The first electrode 244, the second inter-layer dielectric layer 260 and the pixel electrode 270 constitute the second layer capacitor. The pixel electrode 270, the third inter-layer dielectric layer 280 and the second electrode 294 constitute the third layer capacitor. The materials and compositions of the first inter-layer dielectric layer 230, the second inter-layer dielectric layer 260 and the third inter-layer dielectric layer 280 have already been described above and therefore are not to be reiterated herein.

In summary, the fabricating method of the semiconductor structure, the semiconductor structure, the pixel structure and the LCD panel of the present invention have the following advantages:

The fabricating method of the semiconductor structure requires only five photomasks. Therefore, the number of the photomasks is reduced and the fabrication cost is lowered. Moreover, the semiconductor structure and the pixel structure thus fabricated have multi-layer storage capacitors and thereby substantially increasing the storage capacitance. Hence, the LCD panel applying the pixel structure has a better frame display quality.

Although the present invention has been disclosed above by the embodiments, they are not intended to limit the present invention. Anybody ordinarily skilled in the art can make some modifications and alterations without departing from the spirit and scope of the present invention. Therefore, the protecting range of the present invention falls in the appended claims.

What is claimed is:

1. A method for fabricating a semiconductor structure, comprising:
   forming a semiconductor layer on a substrate, the semiconductor layer disposed in an active element area and a storage capacitor area of the substrate;
   forming a first inter-layer dielectric layer to cover the semiconductor layer;
   forming a gate on the first inter-layer dielectric layer in the active element area and a first electrode on the first inter-layer dielectric layer in a storage capacitor area;
   performing a doping process to form a source and a drain in the semiconductor layer in the active element area, and a channel is between the source and the drain;
   forming a second inter-layer dielectric layer to cover the gate and the first electrode;
   forming a patterned conductive layer on the second inter-layer dielectric layer as a pixel electrode;
   forming a third inter-layer dielectric layer to cover the patterned conductive layer;
   patterning the third inter-layer dielectric layer to expose the patterned conductive layer and forming a plurality of contact windows in the first, second and third inter-layer dielectric layers to expose the source, the drain, a portion of the patterned conductive layer and the first electrode; and
   forming a second electrode on the third inter-layer dielectric layer disposed over the first electrode and electrically connected to the first electrode, and a source/drain conductive line electrically connecting the semiconductor layer with the patterned conductive layer.

2. The method for fabricating the semiconductor structure as claimed in claim 1, wherein the semiconductor layer and the patterned conductive layer are electrically coupled as a first capacitor electrode, and the first electrode and the second electrode are electrically coupled as a second capacitor electrode.

3. The method for fabricating the semiconductor structure as claimed in claim 2, wherein the first capacitor electrode and the second electrode constitute a storage capacitor.

4. The method for fabricating the semiconductor structure as claimed in claim 1, further comprising forming a patterned protective layer on the second electrode and the source/drain conductive line.

5. The method for fabricating the semiconductor structure as claimed in claim 1, further comprising forming a lightly doped drain area disposed between the source and the channel and between the drain and the channel.

6. The method for fabricating the semiconductor structure as claimed in claim 1, wherein the material of the semiconductor layer comprises poly-silicon.

7. The method for fabricating the semiconductor structure as claimed in claim 1, wherein the materials of the gate and the first electrode are selected from molybdenum (Mo), tungsten molybdenum (MoW), chromium (Cr), titanium (Ti), aluminum (Al), copper (Cu) and a combination of the aforementioned.

8. The method for fabricating the semiconductor structure as claimed in claim 1, wherein the material of the patterned conductive layer comprises indium tin oxide (ITO) or indium zinc oxide (IZO).

9. The method for fabricating the semiconductor structure as claimed in claim 1, wherein the second electrode and the source/drain conductive line comprise a multi-layer metal structure constituted by titanium-aluminum-titanium (Ti—Al—Ti) or molybdenum-aluminum-molybdenum (Mo—Al—Mo).

10. The method for fabricating the semiconductor structure as claimed in claim 1, wherein the materials of the first inter-layer dielectric layer, the second inter-layer dielectric layer and the third inter-layer dielectric layer are selected from silicon nitride, silicon oxide, silicon oxynitride and a combination thereof.

11. A semiconductor structure, comprising:
   a semiconductor layer, disposed on an active element area and a storage capacitor area of a substrate, the semiconductor layer in the active element area comprising a source, a drain and a channel disposed between the source and the drain;
   a first inter-layer dielectric layer, covering the semiconductor layer;
   a gate and a first electrode, the gate disposed on the first inter-layer dielectric layer in the active element area, the first electrode disposed on the first inter-layer dielectric layer in the storage capacitor area, and the gate, the source and the drain constituting an active element;
   a second inter-layer dielectric layer, covering the gate and the first electrode;
   a patterned conductive layer, disposed on the second inter-layer dielectric layer and serving as a pixel electrode;
   a third inter-layer dielectric layer, covering the patterned conductive layer;
   a plurality of contact windows, disposed in the first, second and third inter-layer dielectric layers so as to expose the patterned conductive layer, the source, the drain and the first electrode; and
   a second electrode and a source/drain conductive line, disposed on the third inter-layer dielectric layer, the second electrode disposed over the first electrode and electrically connected to the first electrode, the source/drain conductive line electrically connecting the semiconductor layer with the patterned conductive layer.

12. The semiconductor structure as claimed in claim 11, wherein the semiconductor layer and the patterned conductive layer are electrically coupled as a first capacitor electrode, and the first electrode and the second electrode are electrically coupled as a second capacitor electrode.

13. The semiconductor structure as claimed in claim 12, wherein the first capacitor electrode and the second capacitor electrode constitute a storage capacitor.

14. The semiconductor structure as claimed in claim 11, further comprising a patterned protective layer covering the second electrode and the source/drain conductive line.

15. The semiconductor structure as claimed in claim 14, wherein the patterned conductive layer further comprises a contact pad disposed on the periphery of the substrate so as to electrically connect the active element to other electronic elements.

16. The semiconductor structure as claimed in claim 11, further comprising a lightly doped drain area disposed between the source and the channel and between the drain and the channel.

17. The semiconductor structure as claimed in claim 11, wherein the material of the semiconductor layer comprises poly-silicon.

18. The semiconductor structure as claimed in claim 11, wherein the material of the patterned conductive layer comprises indium tin oxide (ITO) or indium zinc oxide (IZO).

19. The semiconductor structure as claimed in claim 11, wherein the second electrode and the source/drain conductive line comprise a multi-layer metal structure constituted by titanium-aluminum-titanium (Ti—Al—Ti) or molybdenum-aluminum-molybdenum (Mo—Al—Mo).

20. The semiconductor structure as claimed in claim 11, wherein the materials of the first inter-layer dielectric layer, the second inter-layer dielectric layer and the third inter-layer dielectric layer are selected from silicon nitride, silicon oxide, silicon oxynitride and a combination thereof.

21. A pixel structure, suitable for being disposed on a substrate, comprising:
   an active element; and
   a multi-layer storage capacitor, electrically connected to the active element, the multi-layer storage capacitor comprising:
      a semiconductor layer, disposed on the substrate;
      a first electrode, disposed over the semiconductor layer;
      a pixel electrode, disposed over the first electrode;
      a second electrode, disposed over the pixel electrode;
   wherein the semiconductor layer and the pixel electrode are electrically coupled as a first capacitor electrode, the first electrode and the second electrode are electrically coupled as a second capacitor electrode, and the first capacitor electrode and the second capacitor electrode constitute the multi-layer storage capacitor.

22. The pixel structure as claimed in claim 21, wherein the active element comprises a low temperature poly-silicon thin film transistor (LTPS-TFT).

23. A liquid crystal display (LCD) panel, comprising:
   a thin film transistor (TFT) array substrate comprising a plurality of pixel structures, wherein each of the pixel structures comprises:
      an active element; and
      a multi-layer storage capacitor, electrically connected to the active element,
      the multi-layer storage capacitor comprising:
         a semiconductor layer, disposed on the TFT array substrate;
         a first electrode, disposed over the semiconductor layer;
         a pixel electrode, disposed over the first electrode;
         a second electrode, disposed over the pixel electrode;
      wherein the semiconductor layer and the pixel electrode are electrically coupled as a first capacitor electrode, the first electrode and the second electrode are electrically coupled as a second capacitor electrode, and the first capacitor electrode and the second capacitor electrode constitute the multi-layer storage capacitor;
   a color filter substrate, disposed opposite to the TFT array substrate; and
   a liquid crystal layer, disposed between the TFT array substrate and the color filter substrate.

24. The LCD panel as claimed in claim 23, wherein the color filter substrate comprises:
   a substrate;
   a color filter layer, disposed on the substrate; and
   a common electrode, disposed on the color filter layer and opposite to the pixel electrode.

* * * * *